United States Patent [19]

Ando

[11] 4,162,540
[45] Jul. 24, 1979

[54] CLOCKED MEMORY WITH DELAY ESTABLISHER BY DRIVE TRANSISTOR DESIGN

[75] Inventor: Hisashige Ando, Santa Clara, Calif.

[73] Assignee: Fujitsu Limited, Japan

[21] Appl. No.: 887,954

[22] Filed: Mar. 20, 1978

[51] Int. Cl.² .......................... G11C 7/00; G11C 7/06
[52] U.S. Cl. .................................... 365/194; 365/190; 365/205
[58] Field of Search ................ 365/154, 189, 190, 205, 365/194

[56] References Cited

U.S. PATENT DOCUMENTS

| | | | |
|---|---|---|---|
| 3,949,383 | 4/1976 | Askin et al. ........................... | 365/190 |
| 3,978,459 | 8/1976 | Koo ...................................... | 365/190 |
| 4,038,646 | 7/1977 | Mehta et al. .......................... | 365/205 |
| 4,085,457 | 4/1978 | Itoh ...................................... | 365/205 |

*Primary Examiner*—Stuart N. Hecker
*Attorney, Agent, or Firm*—Schatzel & Hamrick

[57] ABSTRACT

A clocked memory comprising a memory matrix having a plurality of memory cells arranged in rows and columns on a semiconductor substrate; a plurality of word select lines in said memory matrix, a plurality of bit lines crossing said select lines and connecting to said memory cells in each column; a drive circuit for driving said word select lines; a plurality of presence amplifiers connected to said bit lines; and a sense clock line parallel to said word select lines and connected to a gate of a transistor in said presence amplifier; and a presense drive circuit connected to said sense clock line and operated by a clock signal, said presense drive circuit having a transistor with controlled charging capability so as to conduct said transistor responsive to the charge of the memory cell in said each column.

14 Claims, 5 Drawing Figures

Fig_1

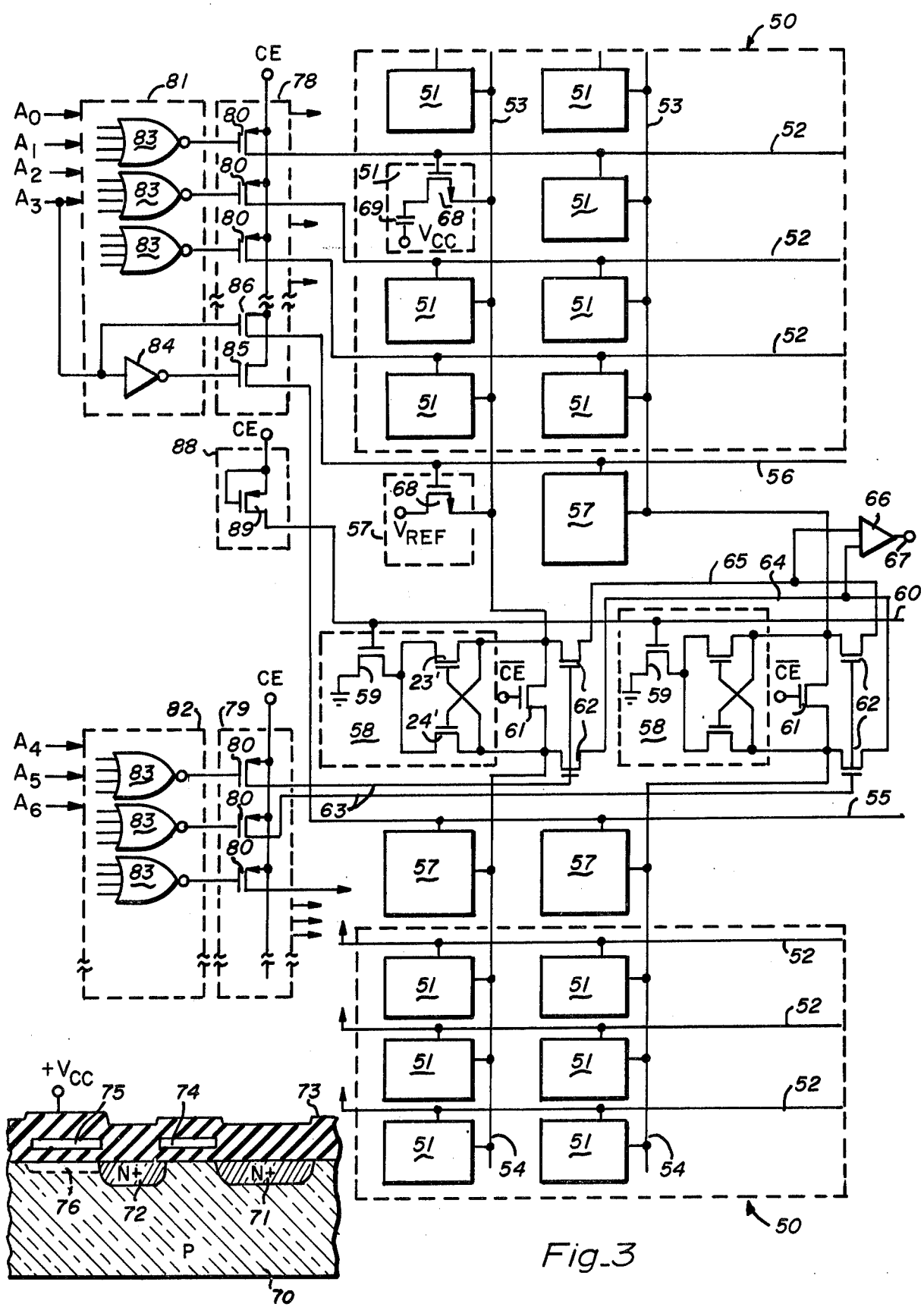
Fig_3
Fig_4

CLOCKED MEMORY WITH DELAY ESTABLISHER BY DRIVE TRANSISTOR DESIGN

BACKGROUND OF THE INVENTION

1. Field of the Invention

This invention relates to a clocked memory formed on a semiconductor substrate and more specifically a clocked memory with an improved sense driver for a dynamic sense amplifier.

2. Description of the Prior Art

Conventional static memories formed on semiconductor substrates have been produced by using semiconductor technology, especially metal oxide semiconductor (MOS) technology. In such memories, a plurality of memory cells are arranged in a matrix on a semiconductor substrate, e.g., a silicon wafer with each memory cell connected to a word select line and a pair of bit lines formed on the substrate. Frequently, the memory cells each include a latch or flip-flop circuit formed by MOS transistors. The word select lines are connected to and selected by a row address decoder and each pair of bit lines are connected to and selected by a column address decoder. A latch or dynamic presense amplifier is connected between the pair of bit lines to detect a signal from the selected memory cell in each column. The signal from the selected memory cell is finally amplified by a sense amplifier commonly connected to data lines which are connected to each bit line in each column.

With dynamic memories significant difficulties have been encountered in detecting the signal. This is due to the fact that the signal is frequently considerably smaller than a required output level, usually 5 volts. In dealing with such a small signal, it need be given special consideration for driving the presence amplifier which is to gradually enable the presense amplifier to ensure detection of the signal.

Heretofore, in the early stages of designing the detection circuitry for the memories, a multi-phase clock generator was provided to drive the decoders and the presense amplifiers separately. However, it was necessary to delay a clock signal sufficiently to drive the presense amplifier in the multi-phase clock generator. This was due to the fact that the clock signal was not tracked with a decode clock for driving the decoders. Therefore, it results in enlarging the access time.

Recently, a unique design of the static memory circuit was introduced in which a reference row was created with resistance and capacitive loading equal to that on the word select lines. The reference row is a part of the memory matrix and comprised of a reference line loaded with a pair of the transistors in each column which represent the cell loading. A buffer amplifier is connected to the end of the reference line and the buffered output is in turn connected to each presense amplifier in each column. A reference row driver is clocked by the same clock signal as the decoder and supplied to the reference line. The above circuit design is illustrated in an article of *IEEE Journal of Solid-State Circuits,* Volume SC-11, No. 5, October 1976, entitled "Two 4K Static 5-V RAM's." It is noted that the above circuit requires the reference row and the buffer amplifier.

SUMMARY OF THE PRESENT INVENTION

It is an object of the present invention to provide a memory having faster read access time.

It is an object of the present invention to provide a dynamic memory capable of detecting a small signal output.

It is another object to provide a clocked memory capable of generating a delayed sense clock signal synchronized with a word select signal in each column of a memory matrix.

It is a further object to provide a clocked memory with a simple presense clock driver circuit for driving a presense amplifier.

It is a further object to provide a clocked memory with a presense clock drive circuit, said presense clock drive circuit being operated by a clock signal and including a transistor having a controlled driving capability so as to operate a presense amplifier a determined time after selection of a word line.

Briefly, a static memory of the present invention includes a clocked memory having a sense clock line connected to a presense driver. The memory matrix includes a plurality of memory cells with each connected to a word select line and a pair of bit lines through control gates. The sense clock line is formed of the same type material as the word select lines. The presense driver operates responsive to a clock signal and includes a transistor with a controlled charging capability depending on the capacitive load of said sense clock line to provide a delayed clock signal synchronized with the word select signal traveling on the word select line at the selected column.

An advantage of the memory of the present invention is that it is capable of providing a delayed sense clock signal synchronized with a word select signal in a column of the memory matrix so as to provide fast access time.

Another advantage of the present invention is that it provides a dynamic memory capable of detecting a small signal output.

These and other objects and advantages of the present invention will no doubt become apparent after having read the following detailed description of the preferred embodiments which are illustrated in the several figures of the drawing.

IN THE DRAWING

FIG. 3 is a circuit diagram of a clocked dynamic memory circuit in accordance with the present invention;

FIG. 4 is a cross-sectional view of a memory cell used in the circuit of FIG. 3.

DETAILED DESCRIPTION OF THE PREFERRED EMBODIMENT

Figure 1:
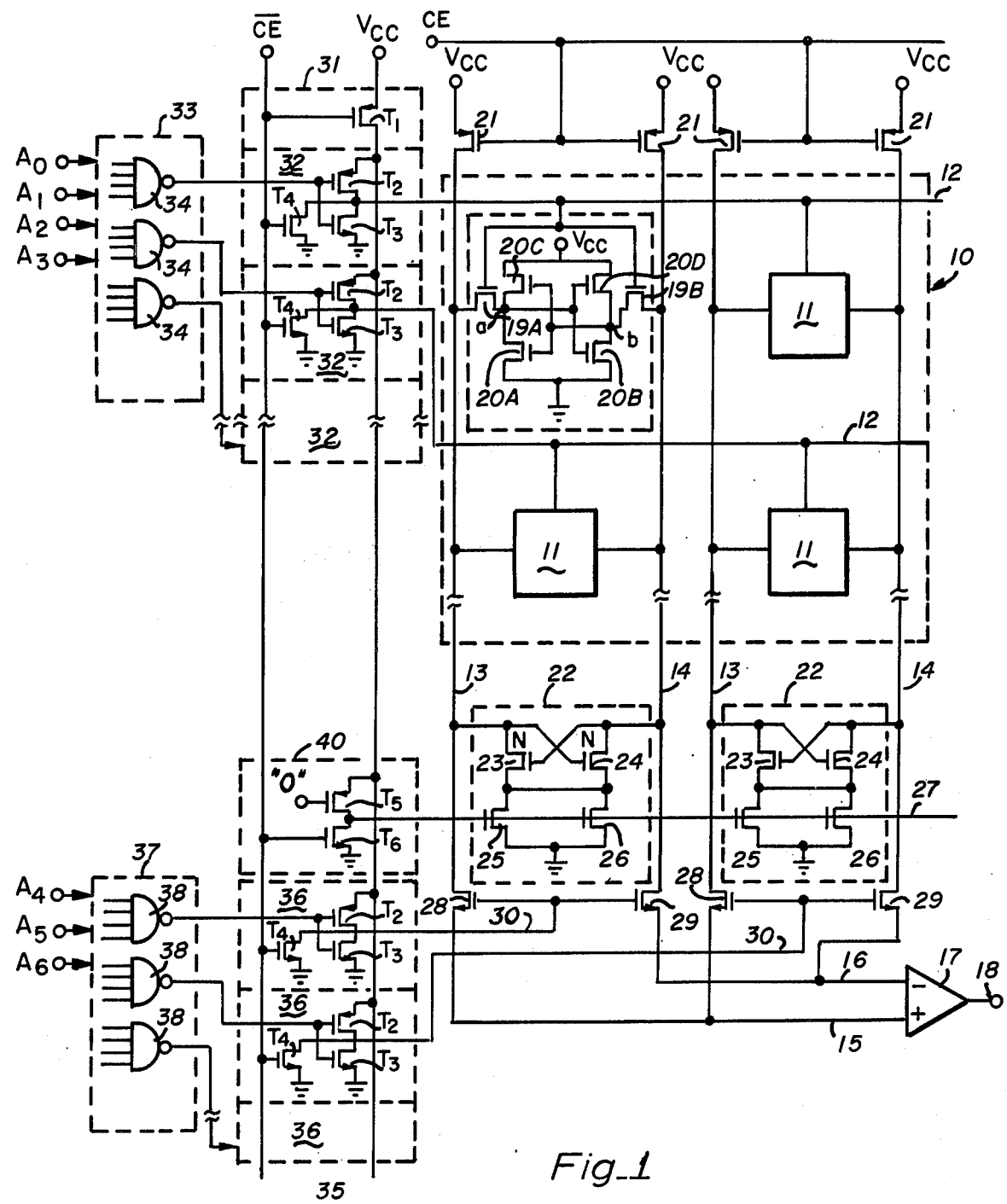
FIG. 1 is a circuit diagram of a clocked static memory in accordance with the present invention.

The clocked static memory circuit diagram of FIG. 1 includes a memory matrix, referred to by the general reference character 10. The matrix 10 is composed of a plurality of memory cells 11 arranged in rows and columns. Each memory cell 11 is connected to a word select line 12 illustrated as extending horizontally and a pair of bit lines 13 and 14, which bit lines are orthogonal to the word select line 12.

Each pair of bit lines 13 and 14 is connected to a pair of data lines 15 and 16, respectively through gating transistors as hereafter explained. The data lines 15 and 16 are in turn connected to a sense amplifier 17 which is in the form of a differential amplifier having an output terminal 18.

The individual memory cells 11 may be comprised of any of various conventional cells. For example, in view of the low power consumption, complementary metal oxide semiconductor (CMOS) transistors may be used to make up the cell. As diagrammatically illustrated in FIG. 1, the cell 11 may be comprised of two N-channels logic-steering transistors 19A and 19B connected to the corresponding bit line 13 and 14, and the associated word select line 12, two N-channels transistors 20A and 20B tied to ground and two P-channel transistors 20C and 20D tied to the potential $V_{cc}$. The transistors 20A, 20B 20C and 20D form a latch or flip-flop for sustaining a memory condition.

The bit lines 13 and 14 joined to a common column of cells 11 are each connected to a pre-charge transistor 21 which is joined to the voltage source $V_{cc}$. The gates of transistors 21 associated with a common column of cells are also tied to each other. The pre-charge transistor 21 may be formed by a P-channel MOS transistor.

Each column of memory cells 11 is connected to a pre-sense amplifier 22. The presense amplifiers 22 include a pair of crosscoupled N-channel transistors 23 and 24 and a pair of transistors 25 and 26. The pair of transistors 25 and 26 corresponds to the logic steering transistors 19a and 19b of the cells 11 in terms of capacitive loading. A single sense clock line 27 crosses over the pair of transistors 25 and 26 in each column.

In each column of memory cells 11, a pair of control gates in the form of transistors 28 and 29 is connected to the bit lines 13 and 14, respectively, to control connection of the bit lines 13 and 14 to the data lines 15 and 16. The gates of the transistors 28 and 29 are tied in common to a column select line 30 to provide a column select means for selecting columns of the memory matrix 10.

A row drive circuit 31 is provided and connected to the word select lines 12. As illustrated, the word drive circuit 31 is comprised of a plurality of CMOS drivers 32, each of which is connected to a word select line 12. The CMOS drivers 32 are each comprised of a P-channel transistor $T_2$ and a pair of N-channel transistors $T_3$ and $T_4$. A transistor $T_1$ is common to all the drivers 32. The transistors $T_1$, $T_2$, $T_3$, and $T_4$ in combination form a NOR gate. The P-channel transistor $T_1$ is connected to the voltage source $V_{cc}$ and its gate is connected to an inverted chip enable signal CE.

A row decoder 33, primarily comprised of NAND gates 34, provides control signals to the row drive circuit 31. The NAND gates 34 receive and respond to a set of address signals, illustrated in these examples as $A_0$, $A_1$, $A_2$ and $A_3$. The gates of the transistor pair $T_2$ and $T_3$ of each element 32 are connected to the output terminals of the NAND gates 34.

A column drive circuit 35, comprising a plurality of CMOS drivers 36 similar to the CMOS drivers 32, is provided. The column drive circuit 35 is adapted to drive any one of the column select lines 30.

A column decoder 37, including a plurality of NAND gates 38, provides control signals to the column drive circuit 35. The NAND gates 38 receive and respond to a set of address signals illustrated in this example as $A_4$, $A_5$ and $A_6$. The NAND gates 38 output the decoded control signal to the column drive circuit 35.

A presense drive circuit 40 is provided and clocked by the same clock enable signal CE as the row and column drive circuits 31 and 35. The presense drive circuit 40 provides a delayed sense clock signal synchronized with the word select signals in each column. The presense drive circuit 40 includes a P-channel transistor $T_5$ and an N-channel transistor $T_6$. The transistor $T_5$ receives a logic "0" signal at its gate while the N-channel transistor $T_6$ is controlled by the CE signal. The transistor $T_5$ has a controlled driving capability. In the illustrated embodiment, the P-channel transistor $T_5$ is designed so as to provide a limited drive current. For this purpose, the transistor $T_5$ is of decreased size. In a special layout design on a substrate, the channel length of the transistor may be fixed so that the channel width is a variable parameter. The transistor $T_5$ is designed to provide the proper delay and generally it has been found adequate to decrease the channel width of the transistor $T_5$ to one-half of the channel width of the driving transistors $T_2$ of the drivers 32.

It should be noted that the word select lines 12 are parallel to the sense clock line 27 and have the same length from the corresponding drive circuits (31, 40) to the selected memory cell 11 thereby equalizing the series resistance. It should be further noted that the sense clock line 27 and word select lines 12 have equal capacitive loading. It is known to use a polycrystalline silicon as the lines 12 and 27. Polycrystalline silicon has relatively high resistivity thereby delaying the signal to be traveled.

The operation of the circuitry of FIG. 1 is believed to be as follows.

The pre-charge transistors 21 are conductive when the chip enable signal CE is at logic signal "0" level thereby equalizing the voltage level of the bit lines 13 and 14 to the $V_{cc}$ level. The address signals $A_0$ to $A_6$ are delivered to the decoders 33 and 37. The CE signal is set to logical "1" shortly after the address signals go through the decoders 33 and 37. Then the row drive circuit 31 generates the row select signal on the word select line 12. Simultaneously, the column drive circuit 35 generates a column select signal on the column select line 30 under the control of the decoder 37. In a particular example, assume that the select lines 12 and 30 are selected so as to select the selected memory cell 11 located in the upper left-hand corner of the matrix, and that the selected memory 11 has been stored in the logical "1" state. In this condition transistor 20A is in the "off" state, transistor 20B is in the conductive state, and transistor 20C is in the conductive state, and transistor 20D is in the "off" state. As a result the junction point "a" of transistors 20A and 20C is at the $V_{cc}$ level and the junction point "b" of transistors 20B and 20D is at ground level. The word select signal on line 12 cause transistors 19A and 19B to conduct. Then the $V_{cc}$ level sustained by the cell's own capacitance, decreases on the bit line 14 because of the path formed by transistors 19B and 20B to ground and the voltage on bit line 13 is sustained because of the path formed by the transistors 19A and 20C to $V_{cc}$. The voltage difference between the line 13 and 14 is amplified or voltage charge on the line 14 is promoted by the presense amplifier 22 associated with that column. The sense clock signal on the line 27 is synchronized with the select signal on the word select line 12 and column select line 30 but still delayed in the amount of $\Delta t_d$ according to the controlled driving capability of transistor $T_5$ of the presense drive circuit 40.

Basically, the delay time $t_d$ of the sense clock signal may be represented as follows:

$$t_d = K + \alpha_0 C_L + \beta R \cdot C_L \qquad (1)$$

where K, $\alpha_0$ and $\beta$ are constants and $C_L$ is a line capacitance including gate capacitances of transistors 25 and 26 of the presense amplifiers 22.

The constant K is primarily concerned with the ratio of stray capacitance and current gain of the driver transistor T5, hence relatively constant when the channel length is fixed.

The constant $\alpha_0$ is primarily concerned with the current gain of the transistor T5 which is further related to the channel width of transistor T5 as heretofore described. The constant $\beta$ is unrelated to the transistor size.

If the transistor T5 is changed to the transistor T2 of the word drive circuit 32, the delay time $T_{dl}$ is represented as:

$$t_{dl} = K + \alpha_1 C_L + \beta R \cdot C_L \qquad (2)$$

where $\alpha_1$ is constant and related to the current gain of T2. The more the current gain of T2 increases, the more the constant $\alpha_1$ decreases. Therefore, the delay $\Delta t_d$ of the sense clock signal relative to the word select signal is expressed as follows:

$$\Delta t_d = t_d - t_{dl} \qquad (3)$$

$$= (\alpha_0 - \alpha_1) C_L \qquad (4)$$

The delayed sense clock signal on the sense line 27 allows the presense amplifier 22 to cut off the transistor 23 and the transistor 24 to conduct in this particular example. As heretofore explained in connection with the illustrative example, the voltage level on bit line 14 is decreasing and that on bit line 13 remains substantially constant. The sense clock signal then gradually causes the transistors 25 and 26 to conduct. Transistor 24 conducts and transistor 23 remains cut off because of the potentials on bit lines 14 and 13, respectively. With the transistor 24 conducting, it further assists in decreasing the voltage level on bit line 14.

Figure 2:
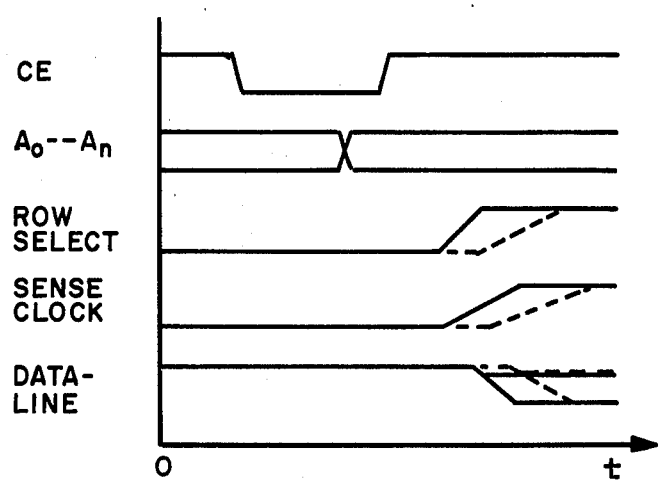
FIG. 2 is a time chart and illustrative waveforms of various signals in said circuit of FIG. 1.

FIG. 2 illustrates a relative time chart of the DATA LINE signal on the data lines 15 and 16, the SENSE CLOCK signal on the line 27; the ROW SELECT signal on the word select line 12; the address signal $A_0$ to $A_3$, and $A_6$ to $A_4$; and the CE clock signal. FIG. 2 further illustrates that the ROW SELECT signal may be delayed, illustrated by the dotted line at cells further removed from the most left-hand side column of cells of the matrix. It follows that the SENSE CLOCK signal is synchronized with the delayed ROW SELECT signal because of the configuration of the parallel word select lines 12 and sense clock line 27. Furthermore, the delayed SENSE CLOCK signal is provided with the controlled waveform by the transistor T5. At the same time column select signals are generated so that the transistors 28 and 29 in the select bit lines 13 and 14 conduct. FIG. 2 illustrates by the broken line that the DATA LINE signal is delayed dependent upon the delay in the ROW SELECT and SENSE CLOCK signals.

The sense amplifier 17 outputs the logical "1" at the terminal 18 in the polarity of the amplifier signal.

It should be noted that the bit lines 13 and 14 may be precharged to the ground level by changing the voltage source of the $V_{cc}$ to ground and the P-channel transistor pair 21 to a pair of N-channel transistors for avoiding voltage offset according to the threshold voltage of the transistor.

Referring to FIG. 3 and 4, a dynamic memory is illustrated. FIG. 3 illustrates a dynamic memory matrix 50 having a plurality of dynamic memory cells 51 arranged in rows and columns. Each cell 51 is connected to a horizontal word select line 52 and a vertical bit 53 or 54. A pair of reference select lines 55 and 56 each connected to a plurality of reference cells 57 provides a pair of reference rows.

A presense amplifier 58, having transistors 23' and 24' (similar to transistors 23 and 24 in FIG. 1), is placed between the reference cells 57 in each pair of bit lines 53 and 54. The amplifier 58 is gated by a transistor 59. The gate of each of the transistors 59 is connected to a sense clock line 60 which is in parallel with the word select lines 52.

The bit lines 53 and 54 are connected to an equalizing transistor 61 and to a transistor pair 62. The gates of each pair of transistors 62 are connected to a column select line 63. In operation, particular bit lines 53 and 54 are selected by actuating the associated transistor pair 62 through an associated column select line 63.

Each bit line 53 and 54 is connected to a pair of data lines 64 and 65 through the associated transistor pair 62. The data lines 64 and 65 are in turn connected to a sense amplifier 66 which is outside of the memory matrix 50 and provided with an output terminal 67.

Referring to the memory cells 51, they are each essentially comprised of an N-channel transistor 68 connected to a capacitor 69. The other terminal of the capacitor 69 is connected to a voltage source $+V_{cc}$. For further explanation, FIG. 4 illustrates a partial cross section of the memory cell 51. As its basic structure and operation is well known, it will only be briefly explained. A P-type silicon substrate 70 is used in which parallel bit lines of N+ type region 71 and a plurality of distinct N+ regions 72 are formed by the conventional method. An insulating layer 73 comprised of silicon dioxide layer and an overcoat layer are formed on the surface of the substrate 70 covering a plurality of gates 74 of polycrystalline silicon which are part of the word line 52. A plurality of electrodes 75 of the polycrystalline silicon are formed on the thin insulating layer to form the capacitor 69. The $+V_{cc}$ creates inversion layer 76 which will become an extended region of the N+ region 72. The N-channel transistor 68 is formed by the N+ regions 71 and 72, and the gate 74.

Again, referring to FIG. 3, a reference coltage $V_{ref}$ one-half of the high level "1" is applied to the reference cells 57. This type of reference cell is well known. Other types of reference cells may be used instead of the illustrated cell 57.

A row drive circuit 78 and column drive circuit 79 are provided. Each drive circuit 78 and 79 comprises a plurality of P-channel transistors 80. The drive circuits 78 and 79 are driven by a row decoder 81 and a column decoder 82, respectively. Each of the decoders 81 and 82 includes a plurality of logic circuits 83. The address input $A_3$ is tied to an inverter 84 which is in turn tied to a gate 85 which is also tied to the reference line 55. Address input $A_3$ is also tied to a gate 86 which is tied to the reference line 56. As is well known, the row decoder 81 drives the drive circuit 78 so as to select one of the upper side word select lines 52 and the lower side reference select line 55, or one of the lower side word select lines 52 and the upper side reference select line 56 for the signal detection.

A presense drive circuit 88, comprising a transistor 89 and clocked by the same clock signal CE, provides a controlled drive current on the sense clock line 60 by the transistor 89.

In the presense amplifier 58, the transistor 59 is connected to the transistors 23' and 24'. In structuring memories, the transistor 68 is generally too small to match the capacitance of the transistor 59 when the transistor 59 is structured to meet fast speed requirements. As a result, the transistor 59 has larger gate capacitance than that of the transistor 68 of the memories 51. Considering the time delay ($t_d$) equation $$t_d = K + \alpha_0 C_L + \beta R\, C_L, \text{ and} \quad (5)$$

$$t_{dl} = K + \alpha_1 C_{L1} + \beta R_1\, C_{L1}, \text{ so that} \quad (6)$$

$$\Delta t_d = t_{dl} - t_d, \text{ or} \quad (7)$$

$$\Delta t_d = (\alpha_1 C_{L1} - \alpha_0 C_L) + \beta(R_1\, C_{L1} - R\, C_L) \text{ where} \quad (8)$$

$C_L$ is the line capacitance of line 52 and gate capacitance of transistors 68, R is the series resistance of line 52, $C_{L1}$ is mainly the gate capacitance of transistor 59, line capacitance of line 60 and stray capacitance, $R_1$ is the series resistance of line 60, $\alpha_0$ is related to the size of transistor 80 and $\alpha_1$ is related to the size of transistor 85. Thus the circuitry is designed so that $$R_1 C_{L1} = R\, C_{L1} \quad (9)$$

by varying R by controlling the width of the line 60. Therefore, $\beta(R_1 C_{L1} = R\, C_L)$ become zero, and the time delay $\Delta t_d$ becomes a function of $$(\alpha_1 C_{L1} - \alpha_0 C_L). \quad (10)$$

To establish $\Delta t_d$, $\alpha_1$ is selected. In this structure $C_L$ is generally smaller than $C_{L1}$ so that $\alpha_1$ need be greater than $\alpha_0$. Since $\alpha_1$ is a function of the size of the transistor 85, the size of the transistor 85 is selected to establish the desired time delay $\Delta t_d$.

Figure 5:
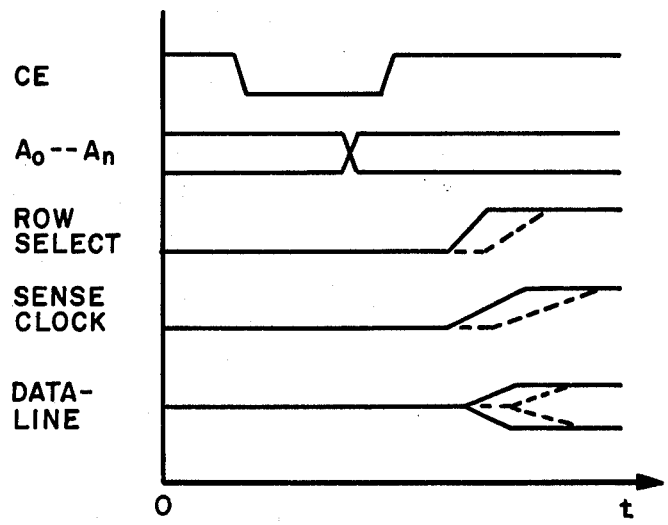
FIG. 5 is a time chart and illustrative waveform of various signals in the circuit of FIG. 3.

Now the operation of the circuits of FIG. 3 will be explained with reference to the time chart of FIG. 5 as follows. During the time that chip enable signal CE is logical "0", the transistors 61 equalizes the voltage level of the bit lines 53 and 54.

Particular address signals $A_0$ to $A_6$ select the proper memory cell 51. Assume that the cell 51 in the uppermost lefthand column is selected together with the reference cell 57 in the lower side. The reference cell 57 is on the bit line 54 and is provided the reference voltage $V_{ref}$. Assuming that the addressed memory cell 51 has been stored in the logical "1," the transistor 68 conducts at first thereby increasing the voltage level of the line 53. Secondly, the precisely delayed clock signal on line 60 operates the transistor 59 which causes the transistors 24' to conduct thus decreasing the voltage on the line 54. Thirdly, the selected transistor pair 62 which are already in the conducting state, connect the selected bit line to pair 62, the data lines 64 and 65. The sense amplifier 66 which is a differential amplifier detects the voltage differential on the lines 64 and 65, and outputs the logical "1" at the terminal 67, in this example.

As the selected column is further removed, the row select signal is delayed. As shown by the dotted lines in the FIG. 5, the delay of the ROW SELECT signal corresponds to the delay of the SENSE CLOCK signal at each column.

While the invention has been particularly shown and described with reference to certain preferred embodiments, it will be understood by those skilled in the art that various alternations and modifications in form and detail may be made therein. Accordingly, it is intended that the following claims cover all such alterations and modifications as fall within the true spirit and scope of the invention.

What is claimed is:

1. A clock memory formed on a semiconductor substrate comprising:
    a semiconductor substrate;
    a memory matrix having a plurality of memory cells arranged in rows and columns on the semiconductor substrate;
    a plurality of parallel word select lines in said memory matrix on the substrate with each of said word select lines connected to the memory cells in a common row;
    a plurality of parallel bit lines in said memory matrix on the substrate, said bit lines crossing said word select lines and each bit line connected to said memory cells in a common column;
    a row drive network having a plurality of row drive circuits connected to said word select lines for driving said word select lines, said row drive circuits each being (operated by ) connected to a clock signal source with the output state of said row drive circuits being responsive to said clock signal and including a drive transistor of a predetermined channel length and channel width;
    a row address decoder connected to the row drive network for receiving address signals and generating control signals to said row drive circuits pursuant to the address signals;
    a plurality of column select lines on the substrate with each column select line being coupled to bit lines of a common column;
    a column drive network having a plurality of column drive circuits with each column drive circuit being connected to a column select line for driving said bit lines coupled to said column select line, said column drive circuits each being connected to said clock signal source with the output state of said column drive circuits being responsive to said clock signal;
    a column address decoder connected to the column drive network for receiving address signals and generating control signals to said column drive circuits pursuant to the address signals;
    a plurality of presense amplifiers connected to said bit lines for detecting signals from selected memory cell in the selected column, each of said presense amplifiers having a latch and gate transistor;
    a sense clock line on the substrate and parallel to said word select lines, said sense clock being connected to each of said presense amplifiers; and
    a presense drive circuit connected to said sense clock line for generating a sense clock signal over the sense clock line, the presense drive circuit being connected to said clock signal source and including a transistor formed in the substrate with controlled (charging) driving current capability dependent on the capacitive load of the sense clock line so as to delay the sense clock signal on the sense clock line to maintain constant time delay between the signals on the word select line and the sense clock line whereby the clock signal on the sense clock line is delayed and synchronized relative to the word select signal traveling on the word select line of the selected column.

2. A clock memory according to claim 1 wherein, the sense clock line is connected to the gates of said gating transistors of said presense amplifiers, and the channel width of said driving transistor of the presense driving circuit is selected relative to the channel width of said driving transistors of the row drive circuits.

3. A clocked memory according to claim 2 further including a pair of data lines extending from said presense amplifiers to receive the output of each of said presense amplifiers.

4. A clocked memory according to claim 3 wherein each column drive circuit includes a driving transistor of a predetermined channel length and channel width; and
said driving transistor of the presense drive circuits is of decreased size relative to said driving transistors of said row drive circuits.

5. A clocked memory circuit formed on a semiconductor substrate comprising:
a semiconductor substrate;
a memory matrix having a plurality of memory cells arranged in rows and columns on the semiconductor substrate, each memory cell having two logic steering transistors;
a plurality of parallel word select lines in said memory matrix on the substrate and connected with said logic steering transistors in said memory cell;
a plurality of parallel bit lines in said memory matrix on the substrate, said bit lines being divided into pairs with a pair of bit lines in each column and crossing said word select lines, each of said memory cells in each column being connected between one of said pair of bit lines;
a row drive network having a plurality of row drive circuits connected to said word select lines for driving said word select lines, said row drive circuits including a driving transistor of a predetermined channel length and channel width connected to a clock signal source with the output state of said row drive circuits being responsive to said clock signal;
a row address decoder connected to the row drive network for receiving address signals and generating control signals to said row drive circuits pursuant to the address signals;
a plurality of column select lines with each column select line being coupled to bit lines of a common column;
a column drive network having a plurality of column drive circuits with each column drive circuit being connected to a column select line for driving said bit lines coupled to said column select line, said column drive circuits including a driving transistor connected to said clock signal source with the conductive state of said column drive circuits being responsive to said clock signal;
a column address decoder connected to the column drive network for receiving address signals and generating control signals to said column drive circuits pursuant to the address signals;
a plurality of presense amplifiers with a presense amplifier connected between each of said pairs of bit lines on each column for detecting signals from selected memory cell in the selected column, each of said presense amplifiers including a pair of latch transistors and at least one gating transistor;
a sense clock line on the substrate and parallel to said word select lines, said sense clock line being connected to said gating transistor of said presense amplifier in each column;
a presense drive circuit connected to said sense clock line, for generating a sense clock signal over the sense clock line, the presense drive circuit being connected to said clock signal source and having a driving transistor with (decreased driving) controlled driving current capability dependent on the capacitive load of the sense clock line so as to delay the sense (for providing a delayed) clock signal on the sense clock line to maintain constant time delay between the signals on the word select line and the sense clock line whereby the delayed clock signal on the sense clock line is synchronized relative to the word select signal traveling on the word select line of the selected column.

6. A clocked memory according to claim 5 further including,
a pair of data lines connected to each of said presense amplifiers to receive the output of each of said presence amplifiers; and
the channel width of said driving transistor of the presense drive circuit is selected relative to the channel width of said driving transistors of the row drive circuits.

7. A clocked memory according to claim 6 further including a sense amplifier connected to said data lines and adapted to provide an output signal responsive to the signals on the data lines.

8. A clocked memory according to claim 5 wherein the resistance capacitance constant of the sense clock line is selected to provide the same signal traveling speed characteristics as that of the word select lines; and
said driving transistors of the presense drive circuit is of decreased size relative to said driving transistors of said row drive circuits 9. A clocked memory according to claim 8 wherein said sense clock line is substantially the same length as said word select lines from said drive circuits.

10. A clocked memory formed on a semiconductor substrate comprising:
a semiconductor substrate;
a memory matrix having a plurality of memory cells arranged in rows and columns on the semiconductor substrate, each memory cell having one transistor and capacitive cell for storing binary information;
a plurality of word select lines in said memory matrix on the substrate each being connected to and loading with said transistors of said memory cells in a common row;
a plurality of bit lines in said memory matrix on the substrate, each of said bit lines crossing said word select lines and connected to said memory cells in a common column;
a plurality of presense amplifiers, each of said presense amplifiers being connected to two bit lines of each column, said presense amplifiers including a latch and a gating transistor;

a sense clock line on the substrate and parallel to said word select lines, said sense clock line being connected to said gating transistor in said presense amplifier in each column;

a presense drive circuit connected to said sense clock line for generating a sense clock signal over the sense clock line, said presense drive circuit being operated by a clock signal and including a driving transistor of a predetermined channel length and channel width with controlled current driving capability for providing a delayed sense clock signal output; and a word and a column drive circuit connected to said plurality of word select lines and column lines respectively, said word and column drive circuits each being operated by said clock signal and each including a driving transistor of a predetermined channel length and channel width with a higher ratio of driving capability to the stray capacitance of the word and column select lines relative to that of said driving transistor in said presense drive circuit.

11. A clocked memory according to claim 10 further including a pair of data lines extending from each of said presense amplifiers to receive the output from each of said presense amplifiers.

12. A clocked memory according to claim 11 further including a sense amplifier connected to said data lines and adapted to provide output signal responsive to the signals on the data lines.

13. The clocked memory of claim 10 wherein
said presense amplifiers are connected to said bit lines with an equal number of memory cells connected on opposing sides of the presense amplifier, and further including
a pair of reference cells in each column with one of said reference cells being connected to the bit line on each side of said presense amplifier in said column.

14. The clocked memory of claim 13 further including a plurality of equalizing transistors each being operated by a chip enabling signal and each being connected in one of said bit lines intermediate the memory cells on opposite sides of the presense amplifier.

* * * * *